US012272601B2

(12) United States Patent
Clark

(10) Patent No.: US 12,272,601 B2
(45) Date of Patent: Apr. 8, 2025

(54) EPITAXIAL HIGH-K ETCH STOP LAYER FOR BACKSIDE REVEAL INTEGRATION

(71) Applicant: Tokyo Electron Limited, Tokyo (JP)

(72) Inventor: Robert D. Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 17/481,512

(22) Filed: Sep. 22, 2021

(65) Prior Publication Data
US 2022/0093466 A1    Mar. 24, 2022

Related U.S. Application Data

(60) Provisional application No. 63/082,926, filed on Sep. 24, 2020.

(51) Int. Cl.
*H01L 21/78* (2006.01)
*H01L 21/306* (2006.01)
*H01L 21/311* (2006.01)
*H10D 86/01* (2025.01)

(52) U.S. Cl.
CPC .... *H01L 21/7806* (2013.01); *H01L 21/30621* (2013.01); *H01L 21/31116* (2013.01); *H10D 86/0214* (2025.01)

(58) Field of Classification Search
CPC ........... H01L 29/1608; H01L 21/32134; H01L 21/32135; H01L 21/6835; H01L 21/76256; H01L 21/7806; H01L 21/7813; H01L 29/2003; H01L 2221/68368; H01L 2924/0002
See application file for complete search history.

(56) References Cited

U.S. PATENT DOCUMENTS

2004/0043548 A1\* 3/2004 Redd ................ H01L 21/30612
                                                              257/E21.441
2011/0163067 A1    7/2011 Oh
2014/0113404 A1    4/2014 Rossini
(Continued)

FOREIGN PATENT DOCUMENTS

WO    WO 2015-148212 A1    10/2015

OTHER PUBLICATIONS

Korean Intellectual Property Office, The International Search Report and Written Opinion for International Application No. PCT/US2021/051424, mailed Jan. 10, 2022, 8 pages.

*Primary Examiner* — Mohammed R Alam

(57) ABSTRACT

A backside reveal method includes providing a semiconductor material substrate, depositing an epitaxial high-k etch stop layer on the semiconductor material substrate, forming an integrated circuit device layer on the epitaxial high-k etch stop layer, and attaching a carrier substrate to a front side of the integrated circuit device layer. The method further includes removing a portion of a thickness of the semiconductor material substrate to leave a remaining portion of the thickness of the semiconductor material substrate, removing, by a first selective etching, the remaining portion of the semiconductor material substrate, and removing, by a second selective etching, the epitaxial high-k etch stop layer to expose a backside of the integrated circuit device layer. The epitaxial high-k etch stop layer has good lattice match and high etch selectivity relative to the semiconductor material substrate.

9 Claims, 3 Drawing Sheets

(56) References Cited

U.S. PATENT DOCUMENTS

| | | | |
|---|---|---|---|
| 2014/0246679 A1* | 9/2014 | Arkun | H01L 21/02458 257/190 |
| 2015/0021624 A1* | 1/2015 | Meyer | H01L 21/32134 257/77 |
| 2016/0260752 A1 | 9/2016 | Shieh et al. | |
| 2017/0301611 A1 | 10/2017 | Cheng et al. | |

* cited by examiner

EPITAXIAL HIGH-K ETCH STOP LAYER FOR BACKSIDE REVEAL INTEGRATION

CROSS REFERENCE TO RELATED PATENTS AND APPLICATIONS

This application claims priority to and the benefit of the filing date of U.S. Non-Provisional Patent Application No. 63/082,926, filed Sep. 24, 2020, which application is incorporated herein by reference in its entirety.

FIELD OF THE INVENTION

The present invention relates to semiconductor processing and semiconductor devices, and more particularly, to methods for revealing the backside of an integrated circuit.

BACKGROUND OF THE INVENTION

In three-dimensional integrated circuit (IC) devices, it is often required to access the device layer of the IC devices from the front side and the backside of the IC devices. Future logic technologies will adopt multidecked logic with wiring that connects devices from both sides of the wafer in order to relieve interconnect crowding and enable 3D integration of logic technology with memory or other devices. Several methods have been developed for backside reveal of the IC devices but they suffer from various problems such as lattice mismatch, limited etch selectivity, high cost, and complexity.

SUMMARY OF THE INVENTION

Embodiments of the invention describe a backside reveal method that uses an epitaxial high-k etch stop layer.

According to one embodiment, the method includes providing a semiconductor material substrate, depositing an epitaxial high-k etch stop layer on the semiconductor material substrate, forming an integrated circuit device layer on the epitaxial high-k etch stop layer, and attaching a carrier substrate to a front side of the integrated circuit device layer. The method further includes removing a portion of a thickness of the semiconductor material substrate to leave a remaining portion of the thickness of the semiconductor material substrate, removing, by a first selective etching, the remaining portion of the semiconductor material substrate, and removing, by a second selective etching, the epitaxial high-k etch stop layer to expose a backside of the integrated circuit device.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
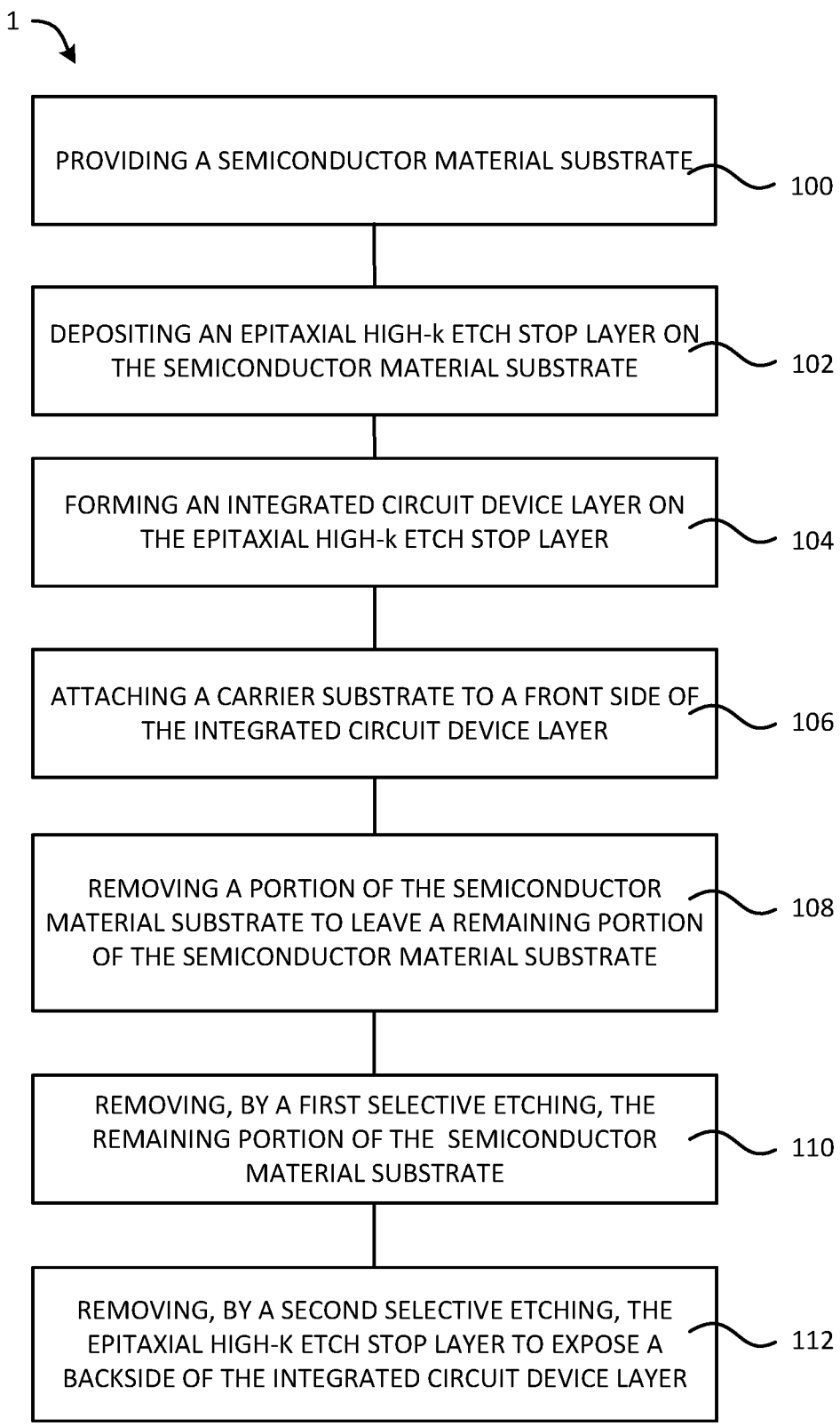
FIG. 1 shows a process flow diagram for a backside reveal process according to an embodiment of the invention.

FIG. 1 shows a process flow diagram for a backside reveal process according to an embodiment of the invention, and FIGS. 2A-2G show through cross-sectional views a backside reveal process according to an embodiment of the invention.

Figure 2A:
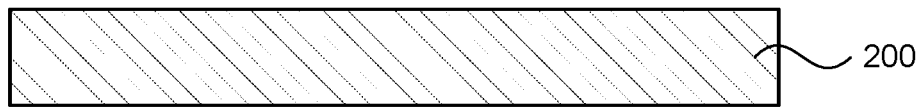
FIGS. 2A-2G show through cross-sectional views a backside reveal process according to an embodiment of the invention.

The process flow 1 includes, in 100, providing a semiconductor material substrate 200. This is schematically shown in FIG. 2A. The semiconductor material substrate 200 may be a type of wafer commonly used in semiconductor manufacturing, for example a 100 mm wafer, a 200 mm wafer, a 300 mm wafer, or a larger wafer. The semiconductor material substrate 200 may be composed of a bulk semiconductor material, for example silicon, germanium, or an III-V compound semiconductor.

Figure 2B:
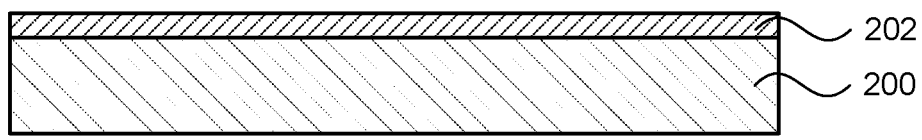

The method further includes, in 102, depositing an epitaxial high-k etch stop layer 202 on the semiconductor material substrate 200. This is schematically shown in FIG. 2B. High-k materials have a dielectric constant (k) greater than that of $SiO_2$ (k~4). In one embodiment, the epitaxial high-k etch stop layer 202 includes a blanket film of a high-k material that is deposited on an unpatterned semiconductor material substrate 200.

According to embodiments of the invention, an epitaxial high-k etch stop layer 202 with good lattice matching with the underlying semiconductor material substrate 200 may be selected. Further, the lattice matching may be fine-tuned by varying the chemical composition of the epitaxial high-k etch stop layer 202, including varying the relative amounts of the different metal elements in the epitaxial high-k etch stop layer 202. In one example, the lattice mismatch may be less than 1%. This suppresses the formation of lattice defects at or near the interface between the semiconductor material substrate 200 and the epitaxial high-k etch stop layer 202. This good lattice match, and good etch selectivity between the epitaxial high-k etch stop layer 202 and the underlying semiconductor material substrate 200, allows for the use of a very thin epitaxial high-k etch stop layer 202. In some examples, a thickness of the epitaxial high-k etch stop layer 202 can be between about 0.5 nm and about 50 nm, between about 0.5 nm and about 20 nm, between about 0.5 nm and about 10 nm, between about 5 nm and about 50 nm, or between about 5 nm and about 20 nm.

Non-limiting examples of the epitaxial high-k etch stop layer 202 include metal oxide materials, mixed metal oxide materials, mixed metal oxynitride materials, and mixed metal nitride materials, where those materials include mixtures of two or more metals. Non-limiting examples of mixed metal oxide materials include:

$Ln^1_x Ln^2_y O_{(x+y)3/2}$, where $Ln^1$ and $Ln^2$ are selected from Scandium (Sc), Yttrium (Y), and the lanthanide series in the Periodic Table of Elements. The lanthanide series includes the elements Lanthanum (La), Cerium (Ce), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), and Lutetium (Lu).

$Ln_x Gf_y O_z$, where Ln is selected from Sc, Y, and the lanthanide series, and Gf is a Group 4 element selected from Titanium (Ti), Zirconium (Zr), Hafnium (Hf), and mixtures thereof. In some examples, z can be approximately 1.5x+2y.

$Ti_x M_y O_z$, where M is selected from Hf, Zr, and mixtures thereof. In some examples, z can be approximately 2(x+y).

$Ln_x Al_y O_{(x+y)3/2}$, where Ln is selected from Sc, Y, the lanthanide series, and mixtures thereof.

$Al_x Gf_y O_z$, where Gf is a Group 4 element selected from Ti, Zr, Hf, and mixtures thereof. In some examples, z can be approximately 1.5x+2y.

The epitaxial high-k etch stop layer 202 may be deposited by vapor phase epitaxy, for example chemical vapor deposition (CVD), atomic layer deposition (ALD), physical vapor deposition (PVD), or pulsed laser deposition. Vapor phase epitaxy is a type of crystal growth or material deposition where new crystalline layers are formed with a well-defined orientation with respect to an underlying crystalline substrate. In one example, ALD of a metal oxide material can include cycles of alternating saturating gaseous exposures of a metal-containing precursor and an oxidizer, where each cycle includes one exposure of one or more metal-containing precursors, followed by one exposure of the oxidizer. The oxidizer may include an oxygen-containing gas, including plasma-excited $O_2$, water ($H_2O$), or ozone ($O_3$).

Each cycle deposits one atomic layer or less of the metal oxide material, and the number of cycles may selected in order to accurately control the film thickness. Steric hindrance of ligands in the metal-containing precursors and the oxidizer, and a limited number of bonding sites, can limit the chemisorption on the substrate surface, and therefore the film growth per cycle can remain at less than one atomic layer.

Embodiments of the invention may utilize a wide variety of metal-containing precursors for the vapor phase epitaxy of the epitaxial high-k etch stop layer 202.

Examples of Zr and Hf precursors for the vapor phase deposition include $Zr(O^tBu)_4$ (zirconium tert-butoxide, ZTB), $Zr(NEt_2)_4$ (tetrakis(diethylamido)zirconium, TDEAZ), $Zr(NMEt)_4$ (tetrakis(ethylmethylamido)zirconium, TEMAZ), $Zr(NMe_2)_4$ (tetrakis(dimethylamido)zirconium, TDMAZ), $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), and $Hf(NMe_2)_4$ (tetrakis(dimethylamido)hafnium, TDMAH). In some examples, tris(dimethylaminocyclopentadienylhafnium ($HfCp(NMe_2)_3$) available from Air Liquide as HyALD™ may be used as a hafnium precursor and tris(dimethylaminocyclopentadienylzirconinum ($ZrCp(NMe_2)_3$) available from Air Liquide as ZyALD™ may be used as a zirconium precursor.

Examples of Ti precursors include $TiCl_4$, $Ti((Et)_2N)_4)$, $Ti((Me)_2N)_4)$, and $Ti((EtMeN)_4)$.

Examples of Al precursors include $Al_2Me_6$, $Al_2Et_6$, [Al(O(sBu))$_3$]$_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Gd precursors include $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Examples of La precursors include $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3 \cdot CH_3(OCH_2CH_2)OCH_3$, $La(C_{11}H_{19}O_2)_3 \cdot CH_3(OCH_2CH_2)OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Examples of Y precursors include $Y(N(SiMe_3)_2)_3$, $Y(N(iPr)_2)_3$, $((iPr)Cp)_3Y$, $Cp_3Y$, $Y(THD)_3$, $Y[OOCCH(C_2H_5)C_4H_9]_3$, $Y(O(iPr))_3$, $Y(acac)_3$, $(C_5Me_5)_2Y$, $Y(hfac)_3$, and $Y(FOD)_3$.

In the above precursors, as well as precursors set forth below, the following common abbreviations are used: Si: silicon; Me: methyl; Et: ethyl; iPr: isopropyl; Bu: butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Following deposition of the epitaxial high-k etch stop layer 202 on the semiconductor material substrate 200, a heat-treating process may be performed using a predetermined substrate temperature and time period to organize the atomic elements, remove contaminants, reduce the layer stress, and lock in the crystallographic orientation of the epitaxial high-k etch stop layer 202. The heat-treating may be performed at a substrate temperature of about 500° C., or lower, between about 200° C. and about 500° C., between about 200° C. and about 300° C., between about 300° C. and about 400° C., or between about 400° C. and about 500° C. The heat-treating may be performed under vacuum conditions in the presence of an inert gas, for example argon or nitrogen.

Figure 2C:
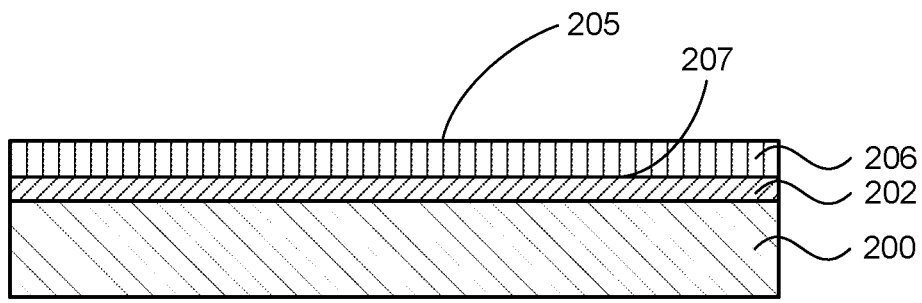

Still referring to FIG. 1, the method further includes, in 104, forming an integrated circuit device layer 206 on the epitaxial high-k etch stop layer 202. This is schematically shown in FIG. 2C. The integrated circuit device layer 206 has a front side 205 and a backside 207 and can contain a plurality of integrated circuit devices. The integrated circuit devices may, for example, include transistor structures such as channel bodies and/or gate/source/drain regions of transistor devices. The integrated circuit device layer 206 may be formed by depositing an epitaxial semiconductor material layer on the epitaxial high-k etch stop layer 202 and, thereafter, forming the integrated circuit devices using well-known semiconductor processes that can include a plurality of film deposition and patterning processes.

Figure 2D:
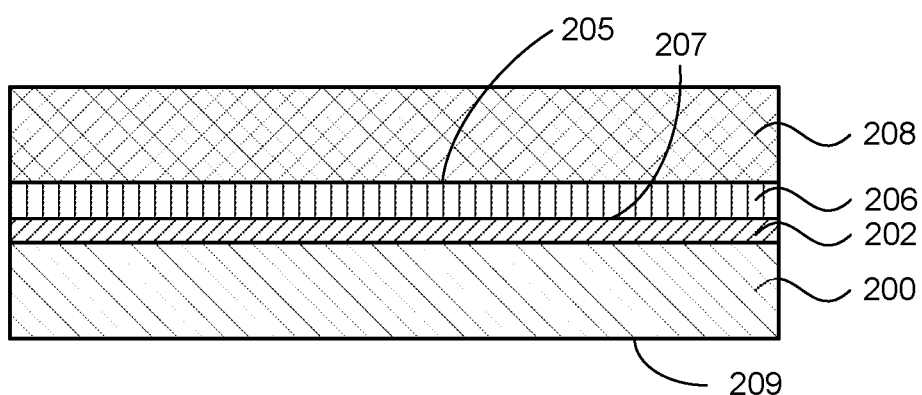

The method further includes, in 106, attaching a carrier substrate 208 to the front side 205 of the integrated circuit device layer 206. This is schematically shown in FIG. 2D. The carrier substrate 208 may be any suitable material, such as silicon. The carrier substrate may be bonded to the front side 205 of the integrated circuit device layer 206 by any suitable mechanism, such as oxide fusion bonding, metallic bonding, or adhesive bonding. In some embodiments, the carrier substrate 208 may include routing features to route electrical signals between the integrated circuit device layer 206 and one or more other devices.

Figure 2E:
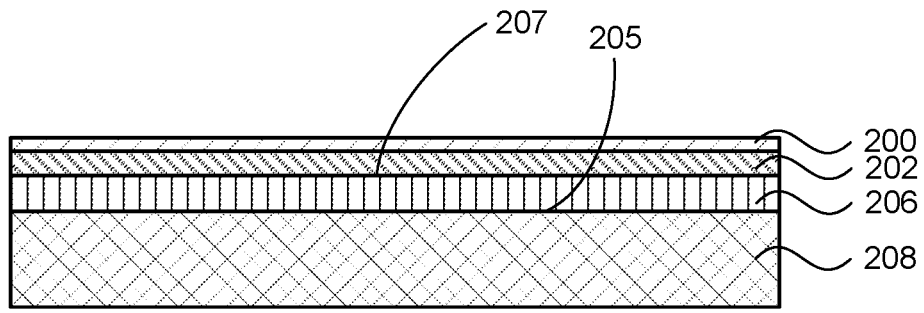

For further processing, the film structure in FIG. 2D may be flipped for accessing the underside 209 of the semiconductor material substrate 200. The method further includes, in 108, removing a portion of a thickness of the semiconductor material substrate 200 from the underside 209 to leave a remaining portion of the thickness of semiconductor material substrate 200. This is schematically shown in FIG. 2E. The thickness of the semiconductor material substrate 200 is a dimension perpendicular through the semiconductor material substrate 200 from the backside 207 of the integrated circuit device layer 206. In semiconductor manufacturing, thickness of a typical unpatterned 200 mm Si wafer is about 725 μm and a thickness of a typical unpatterned 300 mm Si wafer is about 775 μm. The thinning in 108 can include reducing the thickness of the semiconductor material substrate 200 to between about 5 μm and about 10 μm, for example.

According to one embodiment, the removing in 108 includes reducing the thickness of the semiconductor material substrate 200 by mechanical grinding using an abrasive medium.

According to another embodiment, the removing in 108 can include a Smart Cut™ process described in U.S. Pat. No. 5,374,564, where H implant is used to form a defect layer beneath the surface of the semiconductor material substrate

200 before depositing the epitaxial high-k etch stop layer 202 and forming the integrated circuit device layer 206. The defect layer allows for splitting the semiconductor material substrate 200 to removing the portion of a thickness of the semiconductor material substrate 200.

Figure 2F:
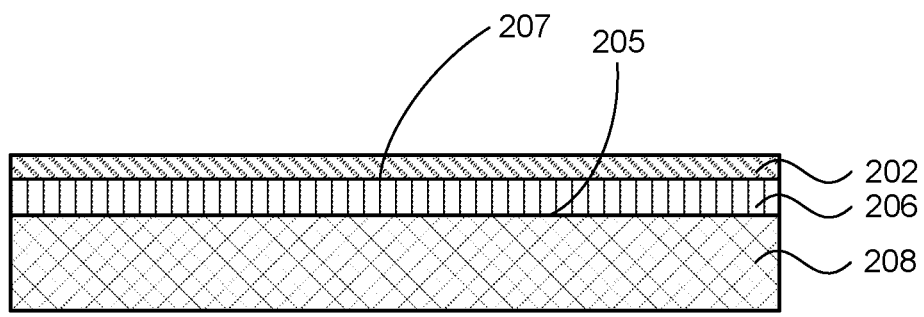

The method further includes, in 110, removing, by a first selective etching, the remaining portion of the semiconductor material substrate 200, and stopping on the epitaxial high-k etch stop layer 202. This is schematically shown in FIG. 2F. The first selective etching may be selected with high selectivity between the semiconductor material substrate 200 and the epitaxial high-k etch stop layer 202.

The selective etching of the semiconductor material substrate 200 may be performed using a wet etching process or a dry etching process. The dry etching process can include reactive ion etching (ME), plasma-enhanced atomic layer etching (PEALE), or thermal ALE. Examples of wet etching processes that may be used include hydrofluoric acid wet etching, potassium hydroxide wet etching, tetramethylammonium hydroxide, and wet etching using a combination of nitric acid, hydrofluoric acid, and acetic acid. Examples of dry etching processes include chlorine-based RIE, hydrogen fluoride vapor etching or reactive ion etching, xenon difluoride vapor etching or reactive ion etching, and carbon tetrafluoride vapor etching or reactive ion etching. The foregoing examples are not limiting for the purpose of this invention, and it will be recognized by one skilled in the art that any selective semiconductor etching process may be employed.

Figure 2G:
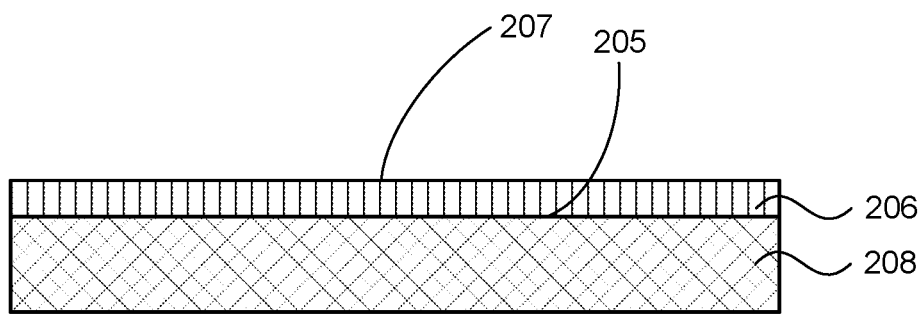

The method further includes, in 112, removing, by a second selective etching, the epitaxial high-k etch stop layer to expose the backside 207 of the integrated circuit device layer 206. This is schematically shown in FIG. 2G. The second selective etching may be selected with high selectivity between the epitaxial high-k etch stop layer 202 and the integrated circuit device layer 206.

The selective etching of the high-k etch stop layer 202 can include an ALE or a continuous etching process. The selective etching can include a wet etching process containing hydrofluoric acid and acetic acid, or tetramethylammonium hydroxide. The selective etching can include a thermal or plasma-enhanced dry etching process using $ClF_3$ or $BCl_3$. An ALE process can include $BCl_3$ and HF, $BCl_3$ and $WF_6$, or HF and trimethyl aluminum, for example. The foregoing examples are for illustration purposes only and are not limiting for this invention. One skilled in the art will recognize that there are many potential processes for selectively etching the high k etch stop layer.

What is claimed is:

1. A backside reveal method, comprising:
   providing a semiconductor material substrate;
   depositing an epitaxial high-k etch stop layer on the semiconductor material substrate,
   forming an integrated circuit device layer on the epitaxial high-k etch stop layer;
   attaching a carrier substrate to a front side of the integrated circuit device layer;
   removing a portion of a thickness of the semiconductor material substrate to leave a remaining portion of the thickness of the semiconductor material substrate;
   removing, by a first selective etching, the remaining portion of the semiconductor material substrate; and
   removing, by a second selective etching, the epitaxial high-k etch stop layer to expose a backside of the integrated circuit device layer, wherein the epitaxial high-k etch stop layer includes a mixed metal oxide with the chemical formula $Ln^1_x Ln^2_y O_{(x+y)3/2}$, wherein $Ln^1$ and $Ln^2$ are selected from Scandium (Sc), Yttrium (Y), and the lanthanide series.

2. The method of claim 1, wherein forming the integrated circuit device layer includes
   depositing an epitaxial semiconductor material layer on the epitaxial high-k etch stop layer; and
   patterning the epitaxial semiconductor material layer.

3. The method of claim 1, wherein the integrated circuit device layer contains transistor structures that include channel bodies, gate/source/drain regions of transistor devices, or both.

4. The method of claim 1, wherein the epitaxial high-k etch stop layer contains at least one of Scandium (Sc), Yttrium (Y), and an element from the lanthanide series.

5. A backside reveal method, comprising:
   providing a semiconductor material substrate;
   depositing an epitaxial high-k etch stop layer on the semiconductor material substrate,
   forming an integrated circuit device layer on the epitaxial high-k etch stop layer;
   attaching a carrier substrate to a front side of the integrated circuit device layer;
   removing a portion of a thickness of the semiconductor material substrate to leave a remaining portion of the thickness of the semiconductor material substrate;
   removing, by a first selective etching, the remaining portion of the semiconductor material substrate; and
   removing, by a second selective etching, the epitaxial high-k etch stop layer to expose a backside of the integrated circuit device layer, wherein the epitaxial high-k etch stop layer includes a mixed metal oxide with one of the following chemical formulas:
   $Ln_x Gf_y O_z$, wherein Ln is selected from Sc, Y, and the lanthanide series, and Gf is a Group 4 element selected from Titanium (Ti), Zirconium (Zr), Hafnium (Hf), and mixtures thereof, or
   $Ti_x M_y O_z$, wherein M is selected from Hf, Zr, and mixtures thereof, or
   $Ln_x Al_y O_{(x+y)3/2}$, wherein Ln is selected from Sc, Y, the lanthanide series, and mixtures thereof, or
   $Al_x Gf_y O_z$, wherein Gf is a Group 4 element selected from Ti, Zr, Hf, and mixtures thereof.

6. The method of claim 1, wherein the epitaxial high-k etch stop layer has less than 1% lattice mismatch to the semiconductor material substrate.

7. The method of claim 1, wherein removing the portion of the thickness of the semiconductor material substrate includes mechanical grinding.

8. A backside reveal method, comprising:
   providing a semiconductor material substrate;
   depositing an epitaxial high-k etch stop layer on the semiconductor material substrate,
   forming an integrated circuit device layer on the epitaxial high-k etch stop layer;
   attaching a carrier substrate to a front side of the integrated circuit device layer;
   removing the semiconductor material substrate from the epitaxial high-k etch stop layer, by selectively etching at least a portion of the semiconductor material substrate; and
   removing, by selective etching, the epitaxial high-k etch stop layer to expose a backside of the integrated circuit device layer,
   wherein the epitaxial high-k etch stop layer includes a mixed metal oxide with at least one of the following chemical formulas:

$Ln^1{}_xLn^2{}_yO_{(x+y)3/2}$, wherein $Ln^1$ and $Ln^2$ are selected from Scandium (Sc), Yttrium (Y), and the lanthanide series, or $Ln_xGf_yO_z$, wherein Ln is selected from Sc, Y, and the lanthanide series, and Gf is a Group 4 element selected from Titanium (Ti), Zirconium (Zr), Hafnium (Hf), and mixtures thereof, or $Ti_xM_yO_z$, wherein M is selected from Hf, Zr, and mixtures thereof, or $Ln_xAl_yO_{(x+y)3/2}$, wherein Ln is selected from Sc, Y, the lanthanide series, and mixtures thereof, or $Al_xGf_yO_z$, wherein Gf is a Group 4 element selected from Ti, Zr, Hf, and mixtures thereof.

9. The method of claim 8, wherein the epitaxial high-k etch stop layer has less than 1% lattice mismatch to the semiconductor material substrate.

\* \* \* \* \*